US012247140B2

(12) United States Patent
Iwano et al.

(10) Patent No.: US 12,247,140 B2
(45) Date of Patent: *Mar. 11, 2025

(54) SLURRY AND POLISHING METHOD

(71) Applicant: Resonac Corporation, Tokyo (JP)

(72) Inventors: Tomohiro Iwano, Tokyo (JP); Takaaki Matsumoto, Tokyo (JP); Tomomi Kukita, Tokyo (JP); Tomoyasu Hasegawa, Tokyo (JP)

(73) Assignee: Resonac Corporation, Tokyo (JP)

( * ) Notice: Subject to any disclaimer, the term of this patent is extended or adjusted under 35 U.S.C. 154(b) by 933 days.

This patent is subject to a terminal disclaimer.

(21) Appl. No.: 17/278,974

(22) PCT Filed: Sep. 25, 2018

(86) PCT No.: PCT/JP2018/035445
§ 371 (c)(1),
(2) Date: Mar. 23, 2021

(87) PCT Pub. No.: WO2020/065723
PCT Pub. Date: Apr. 2, 2020

(65) Prior Publication Data
US 2022/0033680 A1    Feb. 3, 2022

(51) Int. Cl.
C09G 1/02       (2006.01)
C01F 17/235     (2020.01)
C09K 3/14       (2006.01)
H01L 21/304     (2006.01)

(52) U.S. Cl.
CPC .............. *C09G 1/02* (2013.01); *C01F 17/235* (2020.01); *C09K 3/1409* (2013.01); *C09K 3/1454* (2013.01); *H01L 21/304* (2013.01); *C01P 2004/62* (2013.01)

(58) Field of Classification Search
CPC ....... C09G 1/02; C01F 17/235; C09K 3/1409; C09K 3/1454; H01L 21/304; C01P 2004/62
See application file for complete search history.

(56) References Cited

U.S. PATENT DOCUMENTS

| | | | |
|---|---|---|---|
| 5,543,126 A | 8/1996 | Ota et al. | |
| 5,700,180 A | 12/1997 | Sandhu et al. | |
| 6,939,211 B2 | 9/2005 | Taylor et al. | |
| 7,112,123 B2 | 9/2006 | Fang et al. | |
| 11,492,526 B2* | 11/2022 | Hasegawa | H01L 21/31053 |
| 11,499,078 B2* | 11/2022 | Kukita | C09G 1/02 |
| 11,505,731 B2* | 11/2022 | Matsumoto | C09G 1/02 |
| 11,518,920 B2* | 12/2022 | Hasegawa | C09K 3/1463 |
| 2004/0065022 A1 | 4/2004 | Machii et al. | |
| 2004/0152309 A1 | 8/2004 | Carter et al. | |
| 2005/0119360 A1 | 6/2005 | Kawakami et al. | |
| 2007/0044385 A1 | 3/2007 | Yamada | |
| 2010/0081281 A1 | 4/2010 | Babu et al. | |
| 2010/0184359 A1* | 7/2010 | Park | B24B 37/044 451/41 |
| 2011/0275285 A1 | 11/2011 | Satou et al. | |
| 2012/0100718 A1 | 4/2012 | Minami et al. | |
| 2012/0129346 A1 | 5/2012 | Ryuzaki et al. | |
| 2012/0299158 A1 | 11/2012 | Shinoda et al. | |
| 2012/0329371 A1 | 12/2012 | Iwano | |
| 2013/0161285 A1 | 6/2013 | Li et al. | |
| 2015/0140904 A1 | 5/2015 | Iwano et al. | |
| 2015/0232704 A1 | 8/2015 | Akutsu et al. | |
| 2015/0232705 A1 | 8/2015 | Kachi et al. | |
| 2016/0024351 A1 | 1/2016 | Yoshida et al. | |
| 2016/0108284 A1 | 4/2016 | Yoshizaki | |
| 2016/0137881 A1 | 5/2016 | Oota et al. | |
| 2016/0272860 A1 | 9/2016 | Mizoguchi et al. | |
| 2016/0319159 A1 | 11/2016 | Minami et al. | |
| 2017/0183537 A1 | 6/2017 | Yoon et al. | |
| 2017/0183538 A1 | 6/2017 | Kwon et al. | |
| 2017/0194160 A1* | 7/2017 | Pallikkara Kuttiatoor | C09K 3/1463 |
| 2017/0292039 A1 | 10/2017 | Sato et al. | |
| 2018/0043497 A1 | 2/2018 | Hanano et al. | |
| 2018/0072917 A1 | 3/2018 | Kobayashi | |
| 2019/0153264 A1 | 5/2019 | Bottiglieri et al. | |
| 2019/0211245 A1 | 7/2019 | Choi et al. | |
| 2019/0256742 A1 | 8/2019 | Suzuki et al. | |
| 2020/0299544 A1 | 9/2020 | Hanano et al. | |

(Continued)

FOREIGN PATENT DOCUMENTS

| | | |
|---|---|---|
| CN | 101649182 A | 2/2010 |
| CN | 101978018 A | 2/2011 |

(Continued)

OTHER PUBLICATIONS

"Wikipedia, "N-vinylpyrrolidone" via https://en.wikipedia.org/wiki/N-Vinylpyrrolidone", 2020, p. 1-p. 3 (cited in Office Action mailed Mar. 9, 2021 in U.S. Appl. No. 16/981,589).
"Wikipedia, "Poly(N-vinylacetamide)" via https://en.wikipedia.org/wiki/Poly(N• vinylacetamide)", 2019, p. 1-p. 2 (cited in Office Action mailed Mar. 9, 2021 in U.S. Appl. No. 16/981,589).
"Wikipedia, "Polyethylene glycol" via https://en.wikipedia.org/wiki/Polyethylene_glycol", 2021, p. 1-p. 11 (cited in Office Action mailed Mar. 9, 2021 in U.S. Appl. No. 16/981,589).
"Wikipedia, "Tartaric acid" via https://en.wikipedia.org/wiki/Tartaric_acid", 2021, p. 1-p. 9 (cited in Office Action mailed Mar. 9, 2021 in U.S. Appl. No. 16/981,589).
A. Solt, "13.1 Amino Acids," Chemistry Libre Texts, Chem.Libretext. org, 2021 (Cited in Office Action mailed May 25, 2021 in U.S. Appl. No. 16/981,573).

(Continued)

*Primary Examiner* — Pegah Parvini
(74) *Attorney, Agent, or Firm* — Fitch, Even, Tabin & Flannery LLP

(57) ABSTRACT

A slurry for polishing a carbon-containing silicon oxide, the slurry containing abrasive grains and a liquid medium, in which the abrasive grains include first particles and second particles in contact with the first particles, a particle size of the second particles is smaller than a particle size of the first particles, the first particles contain cerium oxide, and the second particles contain a cerium compound.

16 Claims, No Drawings

(56) References Cited

U.S. PATENT DOCUMENTS

| | | | |
|---|---|---|---|
| 2021/0017422 A1 | 1/2021 | Iwano | |
| 2021/0189175 A1 | 6/2021 | Gagliardi et al. | |

FOREIGN PATENT DOCUMENTS

| | | | |
|---|---|---|---|
| CN | 102232242 | A | 11/2011 |
| CN | 103189457 | A | 7/2013 |
| CN | 103222035 | A | 7/2013 |
| CN | 103339219 | A | 10/2013 |
| CN | 104334675 | A | 2/2015 |
| CN | 105453235 | A | 3/2016 |
| CN | 105895518 | A | 8/2016 |
| CN | 106471090 | A | 3/2017 |
| CN | 108010878 | A | 5/2018 |
| JP | H8-022970 | A | 1/1996 |
| JP | H10-106994 | A | 4/1998 |
| JP | 2005513765 | A | 5/2005 |
| JP | 2006-249129 | A | 9/2006 |
| JP | 2007318072 | A | 12/2007 |
| JP | 2008112990 | A | 5/2008 |
| JP | 2009290188 | A | 12/2009 |
| JP | 2010153781 | A | 7/2010 |
| JP | 2011-054906 | A | 3/2011 |
| JP | 2011518098 | A | 6/2011 |
| JP | 4941430 | B2 | 5/2012 |
| JP | 2012186339 | A | 9/2012 |
| JP | 2013540851 | A | 11/2013 |
| JP | 201593932 | A | 5/2015 |
| JP | 2015137297 | A | 7/2015 |
| JP | 2016029123 | A | 3/2016 |
| JP | 5943073 | B2 | 6/2016 |
| JP | 2016538359 | A | 12/2016 |
| JP | 201752858 | A | 3/2017 |
| JP | 2017-110177 | A | 6/2017 |
| JP | 2017203076 | A | 11/2017 |
| JP | 2018044046 | A | 3/2018 |
| KR | 2016009150 | A | 1/2016 |
| KR | 1020170004462 | A | 1/2017 |
| KR | 1020170032335 | A | 3/2017 |
| KR | 101737938 | B1 | 5/2017 |
| KR | 1020170097090 | A | 8/2017 |
| KR | 1020180029888 | A | 3/2018 |
| TW | 201518489 | A | 5/2015 |
| TW | 201518492 | A | 5/2015 |
| TW | 201525118 | A | 7/2015 |
| TW | 201610126 | A | 3/2016 |
| TW | 201816060 | A | 5/2018 |
| WO | 97029510 | A1 | 8/1997 |
| WO | 02/067309 | A1 | 8/2002 |
| WO | 2008146641 | A1 | 12/2008 |
| WO | 2009131133 | A1 | 10/2009 |
| WO | 2010143579 | A1 | 12/2010 |
| WO | 2012/070541 | A1 | 5/2012 |
| WO | 2012/070542 | A1 | 5/2012 |
| WO | 2012/070544 | A1 | 5/2012 |
| WO | 2013125441 | A1 | 8/2013 |
| WO | 2014199739 | A1 | 12/2014 |
| WO | 2014208414 | A1 | 12/2014 |
| WO | 2015052988 | A1 | 4/2015 |
| WO | 2015098197 | A1 | 7/2015 |
| WO | 2016006553 | A1 | 1/2016 |
| WO | 2016143797 | A1 | 9/2016 |
| WO | 201743139 | A1 | 3/2017 |
| WO | 2018012174 | A1 | 1/2018 |
| WO | 2018048068 | A1 | 3/2018 |

OTHER PUBLICATIONS

Merricks et al., "Evolution and Revolution of Cerium Oxide Slurries in CMP," Ferro Electronic Material Systems, 2015, pp. 1-6 (Cited in Office Action mailed Mar. 10, 2022 in U.S. Appl. No. 16/981,560).

"Glyceric acid," https://en.wikipedia.org/wiki/Glyceric_acid, 2021, p. 1-p. 2 (Cited in Office Action mailed May 10, 2021 in U.S. Appl. No. 16/981,589).

"Glycolic Acid," https://en.wikipedia.org/wiki/Glycolic_acid, 2021, p. 1-p. 5 (Cited in Office Action mailed May 10, 2021 in U.S. Appl. No. 16/981,589).

"Lactic acid," https://en.wikipedia.org/wiki/Lactic_acid, 2021, p. 1-p. 11 (Cited in Office Action mailed May 10, 2021 in U.S. Appl. No. 16/981,589).

Merriam Webster, Definition of "have," https://www.merriam-webster.com/dictionary/have, 2021, p. 1-p. 14 (Cited in Office Action mailed May 10, 2021 in U.S. Appl. No. 16/981,589).

International Search Report and Written Opinion dated Dec. 11, 2018, for International Application No. PCT/JP2018/035456, together with English language translation, 13 pages.

International Search Report and Written Opinion dated Aug. 1, 2019, for International Application No. PCT/JP2018/035441, together with English language translation, 13 pages.

International Search Report and Written Opinion dated Dec. 25, 2018, for International Application No. PCT/JP2018/035443, together with English language translation, 10 pages.

International Search Report and Written Opinion dated Aug. 1, 2019, for International Application No. PCT/JP2018/035463, together with English language translation, 14 pages.

International Search Report and Written Opinion dated Sep. 24, 2019, for International Application No. PCT/JP2019/028712, together with English language translation, 12 pages.

* cited by examiner

SLURRY AND POLISHING METHOD

CROSS-REFERENCE TO RELATED APPLICATIONS

This application is a U.S. national phase application filed under 35 U.S.C. § 371 of International Application No. PCT/JP2018/035445, filed Sep. 25, 2018, designating the United States, which is hereby incorporated herein by reference in its entirety.

TECHNICAL FIELD

The present invention relates to a slurry and a polishing method.

BACKGROUND ART

In the manufacturing steps for semiconductor elements of recent years, the importance of processing technologies for density increase and micronization is increasing more and more. CMP (Chemical mechanical polishing) technology, which is one of the processing technologies, has become an essential technology for the formation of a shallow trench isolation (hereinafter, referred to as "STI"), flattening of a pre-metal insulating material or an interlayer insulating material, formation of a plug or an embedded metal wiring, and the like in the manufacturing steps for semiconductor elements.

Regarding polishing liquids that are most commonly used, for example, silica-based polishing liquids containing silica (silicon oxide) particles such as fumed silica and colloidal silica as abrasive grains are mentioned. Silica-based polishing liquids have a feature of high flexibility of use, and by appropriately selecting the content of abrasive grains, pH, additives, and the like, polishing of a wide variety of materials can be achieved regardless of whether the material is an insulating material or an electroconductive material.

Meanwhile, as a polishing liquid mainly used for insulating materials such as silicon oxide, a demand for a polishing liquid containing cerium compound particles as abrasive grains is also increasing. For example, a cerium oxide-based polishing liquid containing cerium oxide particles as abrasive grains can polish silicon oxide at a high rate even when the abrasive grain content is lower than that in the silica-based polishing liquid (for example, see Patent Literatures 1 and 2 described below).

Incidentally, in recent years, in the manufacturing steps for semiconductor elements, it is required to achieve further micronization of wiring, and polishing scratches generated at the time of polishing are becoming problematic. That is, when polishing is performed using a conventional cerium oxide-based polishing liquid, even if minute polishing scratches are generated, there has been no problem as long as the sizes of the polishing scratches are smaller than conventional wiring widths; however, in a case where it is directed to achieve further micronization of the wiring, even minute polishing scratches become problematic.

With regard to this problem, an investigation has been conducted on polishing liquids that use particles of cerium hydroxide (for example, see Patent Literatures 3 to 5 described below). Furthermore, methods for producing particles of cerium hydroxide have also been investigated (for example, see Patent Literatures 6 and 7 described below).

CITATION LIST

Patent Literature

Patent Literature 1: Japanese Unexamined Patent Publication No. H10-106994
Patent Literature 2: Japanese Unexamined Patent Publication No. H08-022970
Patent Literature 3: International Publication WO 2002/067309
Patent Literature 4: International Publication WO 2012/070541
Patent Literature 5: International Publication WO 2012/070542
Patent Literature 6: Japanese Unexamined Patent Publication No. 2006-249129
Patent Literature 7: International Publication WO 2012/070544

SUMMARY OF INVENTION

Technical Problem

Incidentally, in recent years, 3D-NAND devices in which the cell portions of a device are laminated in the longitudinal direction have come to the fore. In the present technology, the level differences of the insulating materials during cell formation are several times higher compared to the conventional planar types. According to this, in order to maintain the throughput of the device production, it is necessary to rapidly resolve the high level differences as described above in a CMP step or the like, and it is necessary to improve the polishing rate for an insulating material.

In recent years, a carbon-containing silicon oxide is used as an insulating material in some cases. Therefore, from the viewpoint of rapidly resolving the aforementioned level differences even in the case of using a carbon-containing silicon oxide, it is required to improve the polishing rate for a carbon-containing silicon oxide.

The present invention is directed to solve the problems described above, and an object of the present invention is to provide a slurry capable of improving the polishing rate for a carbon-containing silicon oxide, and a polishing method using the slurry.

Solution to Problem

A slurry of an aspect of the present invention is a slurry for polishing a carbon-containing silicon oxide, the slurry containing abrasive grains and a liquid medium, in which the abrasive grains include first particles and second particles in contact with the first particles, a particle size of the second particles is smaller than a particle size of the first particles, the first particles contain cerium oxide, and the second particles contain a cerium compound.

According to the slurry of the aspect of the present invention, it is possible to improve the polishing rate for a carbon-containing silicon oxide, and therefore, a carbon-containing silicon oxide can be polished at a high polishing rate.

A polishing method of another aspect of the present invention includes a step of polishing a surface to be polished by using the above-described slurry. According to such a polishing method, the above-described effects similar to those obtainable with the above-described slurry can be obtained by using the above-described slurry.

Advantageous Effects of Invention

According to the present invention, it is possible to provide a slurry capable of improving the polishing rate for a carbon-containing silicon oxide. According to the present invention, a polishing method using the above-described slurry can be provided.

According to the present invention, it is possible to provide use of a slurry in polishing of a carbon-containing silicon oxide.

According to the present invention, it is possible to provide use of a slurry in a flattening step of a base substrate surface that is the manufacturing technology of semiconductor elements. According to the present invention, it is possible to provide use of a slurry for a flattening step of an STI insulating material, a pre-metal insulating material, or an interlayer insulating material.

DESCRIPTION OF EMBODIMENTS

Hereinafter, embodiments of the present invention will be described in detail.

Definition

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specifically indicated. In the present specification, when a plurality of substances corresponding to each component exist in the composition, the content of each component in the composition means the total amount of the plurality of substances that exist in the composition, unless otherwise specified. The term "step" includes not only an independent step but also a step by which an intended action of the step is achieved, though the step cannot be clearly distinguished from other steps.

As described later, a slurry of the present embodiment contains abrasive grains. The abrasive grains are also referred to as "abrasive particles"; however, in the present specification, the term "abrasive grains" is used. Abrasive grains are generally solid particles, and it is considered that at the time of polishing, an object to be removed is removed by the mechanical action (physical action) of the abrasive grains and the chemical action of the abrasive grains (mainly the surface of the abrasive grains); however, it is not limited to this. The polishing rate in the case of using the slurry of the present embodiment can be compared, for example, on the basis of a polishing rate obtained when the content of the abrasive grains (the total amount of particles) is adjusted to 0.1% by mass on the basis of the total mass of the slurry.

The weight average molecular weight in the present specification can be measured, for example, by a gel permeation chromatography method (GPC) under the following conditions using a calibration curve of standard polystyrene.

Instrument used: Hitachi L-6000 Model [manufactured by Hitachi, Ltd.]
Column: Gel-Pak GL-R420+Gel-Pak GL-R430+Gel-Pak GL-R440 [manufactured by Hitachi Chemical Co., Ltd., trade names, three columns in total]
Eluent: tetrahydrofuran
Measurement temperature: 40° C.
Flow rate: 1.75 mL/min
Detector: L-3300RI [manufactured by Hitachi, Ltd.]

<Slurry>

The slurry of the present embodiment is a slurry for polishing a carbon-containing silicon oxide. Examples of the carbon-containing silicon oxide include black diamond.

The slurry of the present embodiment contains abrasive grains and a liquid medium as essential components. The slurry of the present embodiment can be used as, for example, a polishing liquid (CMP polishing liquid). In the present specification, the term "polishing liquid" (abrasive) is defined as a composition to be brought into contact with a surface to be polished, at the time of polishing. The term "polishing liquid" itself does not at all limit the components that are contained in the polishing liquid.

The abrasive grains include composite particles including first particles and second particles in contact with the first particles. The particle size of the second particles is smaller than the particle size of the first particles. The first particles contain cerium oxide and the second particles contain a cerium compound.

The polishing rate for a carbon-containing silicon oxide can be improved by using the slurry of the present embodiment. The reasons why the polishing rate is improved in this way are, for example, the reasons to be as follows. However, the reasons are not limited to the reasons to be as follows.

That is, the first particles containing cerium oxide and having a larger particle size than that of the second particles have strong mechanical action (mechanical property) with respect to a carbon-containing silicon oxide as compared to the second particles. On the other hand, the second particles containing a cerium compound and having a smaller particle size than that of the first particles have small mechanical action with respect to a carbon-containing silicon oxide as compared to the first particles, but have strong chemical action (chemical property) with respect to a carbon-containing silicon oxide since the specific surface area (surface area per unit mass) in the whole particle is large. Therefore, a synergetic effect of improving the polishing rate is easily obtained by using the first particles having strong mechanical action and the second particles having strong chemical action.

Furthermore, in a carbon-containing silicon oxide, there is a tendency that hydrophobicity becomes stronger than that in the case of not containing carbon. In this case, there is a tendency that the affinity of silicon oxide with respect to a slurry containing a liquid medium such as water becomes lower, and thus a decrease in polishing rate is likely to occur in the case of using conventional particles. On the other hand, when the aforementioned composite particles are used in polishing, the aforementioned synergetic effect of improving the polishing rate is obtained, and thereby a sufficient polishing action is exhibited also with respect to a material to be polished (carbon-containing silicon oxide) having relatively low affinity.

As described above, it is speculated that the polishing rate for a carbon-containing silicon oxide can be improved by using the slurry of the present embodiment.

(Abrasive Grains)

As described above, the abrasive grains of the slurry of the present embodiment include composite particles including first particles and second particles in contact with the first particles. The particle size of the second particles is smaller than the particle size of the first particles. The magnitude relationship in particle size between the first particles and the second particles can be determined from SEM images of the composite particles, or the like.

The lower limit of the particle size of the first particles is preferably 15 nm or more, more preferably 25 nm or more, further preferably 35 nm or more, particularly preferably 40 nm or more, extremely preferably 50 nm or more, highly preferably 80 nm or more, and even more preferably 100 nm or more, from the viewpoint that the polishing rate for a carbon-containing silicon oxide is further improved. The upper limit of the particle size of the first particles is preferably 1000 nm or less, more preferably 800 nm or less, further preferably 600 nm or less, particularly preferably 400 nm or less, extremely preferably 300 nm or less, highly preferably 200 nm or less, and even more preferably 150 nm or less, from the viewpoint of improving the dispersibility of the abrasive grains and the viewpoint of easily suppressing scratches at a polished surface. From the above-described viewpoints, the particle size of the first particles is more preferably 15 to 1000 nm. The average particle size (average secondary particle size) of the first particles may be in the above ranges.

The lower limit of the particle size of the second particles is preferably 1 nm or more, more preferably 2 nm or more, and further preferably 3 nm or more, from the viewpoint that the polishing rate for a carbon-containing silicon oxide is further improved. The upper limit of the particle size of the second particles is preferably 50 nm or less, more preferably 30 nm or less, further preferably 25 nm or less, particularly preferably 20 nm or less, extremely preferably 15 nm or less, and highly preferably 10 nm or less, from the viewpoint of improving the dispersibility of the abrasive grains and the viewpoint of easily suppressing scratches at a polished surface. From the above-described viewpoints, the particle size of the second particles is more preferably 1 to 50 nm. The average particle size (average secondary particle size) of the second particles may be in the above ranges.

The average particle size (average secondary particle size) of the abrasive grains (the entirety of the abrasive grains such as the composite particles) in the slurry is preferably in the following range. The lower limit of the average particle size of the abrasive grains is preferably 16 nm or more, more preferably 20 nm or more, further preferably 30 nm or more, particularly preferably 40 nm or more, extremely preferably 50 nm or more, highly preferably 100 nm or more, even more preferably 120 nm or more, and further preferably 140 nm or more, from the viewpoint that the polishing rate for a carbon-containing silicon oxide is further improved. The upper limit of the average particle size of the abrasive grains is preferably 1050 nm or less, more preferably 1000 nm or less, further preferably 800 nm or less, particularly preferably 600 nm or less, extremely preferably 500 nm or less, highly preferably 400 nm or less, even more preferably 300 nm or less, further preferably 200 nm or less, particularly preferably 160 nm or less, and extremely preferably 155 nm or less, from the viewpoint of improving the dispersibility of the abrasive grains and the viewpoint of easily suppressing scratches at a polished surface. From the above-described viewpoints, the average particle size of the abrasive grains is more preferably 16 to 1050 nm.

The average particle size can be measured, for example, using a light diffraction scattering type particle size distribution meter (for example, trade name: N5 manufactured by Beckman Coulter, Inc. or trade name: MICROTRAC MT3300EXII manufactured by MicrotracBEL Corp.).

The first particles contain cerium oxide (for example, ceria) and the second particles contain a cerium compound. Examples of the cerium compound of the second particles include cerium hydroxide and cerium oxide. As the cerium compound of the second particles, a compound different from cerium oxide can be used. The cerium compound preferably contains cerium hydroxide. The abrasive grains containing cerium hydroxide have higher reactivity (chemical action) with a carbon-containing silicon oxide by the action of the hydroxyl group than particles composed of silica, cerium oxide, or the like, and a carbon-containing silicon oxide can be polished at a higher polishing rate. The cerium hydroxide is, for example, a compound containing tetravalent cerium ($Ce^{4+}$) and at least one hydroxide ion ($OH^-$). The cerium hydroxide may contain an anion (for example, nitrate ion $NO_3^-$ and sulfate ion $SO_4^{2-}$) other than a hydroxide ion. For example, the cerium hydroxide may also contain an anion (for example, nitrate ion $NO_3^-$ and sulfate ion $SO_4^{2-}$) bonded to tetravalent cerium.

The cerium hydroxide can be prepared by reacting a cerium salt with an alkali source (base). The cerium hydroxide is preferably prepared by mixing a cerium salt with an alkali liquid (for example, alkali aqueous solution). Thereby, it is possible to obtain particles having an extremely fine particle size, and easily obtain a slurry excellent in an effect of reducing polishing scratches. Such a technique is disclosed in, for example, Patent Literatures 6 and 7. The cerium hydroxide can be obtained by mixing a cerium salt solution (for example, a cerium salt aqueous solution) with alkali liquid. As the cerium salt, conventionally known salts can be used without any particular limitation, and examples thereof include $Ce(NO_3)_4$, $Ce(SO_4)_2$, $Ce(NH_4)_2(NO_3)_6$, and $Ce(NH_4)_4(SO_4)_4$.

The composite particles including the first particles and the second particles can be obtained by bringing the first particles and the second particles into contact with each other using a homogenizer, a nanomizer, a ball mill, a bead mill, a sonicator, or the like; by bringing the first particles and the second particles each having opposing charges to each other into contact with each other; by bringing the first particles and the second particles into contact with each other in a state of a small content of the particles; or the like.

The lower limit of the content of cerium oxide in the first particles is preferably 50% by mass or more, more preferably 70% by mass or more, further preferably 90% by mass or more, and particularly preferably 95% by mass or more, on the basis of the entire first particles (the entire first particles contained in the slurry; the same applies hereinafter), from the viewpoint that the polishing rate for a carbon-containing silicon oxide is further improved. The first particles may be an embodiment substantially composed of cerium oxide (an embodiment in which substantially 100% by mass of the first particles are cerium oxide).

The lower limit of the content of the cerium compound in the second particles is preferably 50% by mass or more, more preferably 70% by mass or more, further preferably 90% by mass or more, and particularly preferably 95% by mass or more, on the basis of the entire second particles (the entire second particles contained in the slurry; the same applies hereinafter), from the viewpoint that the polishing rate for a carbon-containing silicon oxide is further improved. The second particles may be an embodiment substantially composed of a cerium compound (an embodiment in which substantially 100% by mass of the second particles are a cerium compound).

The content of the second particles can be estimated on the basis of a value of absorbance of equation below which is obtained by a spectrophotometer when light having a specific wavelength is transmitted through the slurry. That is, in a case where particles absorb light having a specific wavelength, the light transmittance of a region containing these particles is decreased. The light transmittance is decreased not only by absorption of the particles but also by scattering, but in the second particles, the influence of scattering is small. Therefore, in the present embodiment, the content of the second particles can be estimated on the basis of a value of absorbance calculated by equation below.

$$\text{Absorbance} = -\text{LOG}_{10}(\text{Light transmittance}[\%]/100)$$

The lower limit of the content of the first particles in the abrasive grains is preferably 50% by mass or more, more preferably more than 50% by mass, further preferably 60% by mass or more, particularly preferably 70% by mass or more, and extremely preferably 75% by mass or more, on the basis of the entire abrasive grains (the entire abrasive grains contained in the slurry; the same applies hereinafter), from the viewpoint that the polishing rate for a carbon-containing silicon oxide is further improved. The upper limit of the content of the first particles in the abrasive grains is preferably 95% by mass or less, more preferably 93% by mass or less, further preferably 90% by mass or less, particularly preferably 88% by mass or less, extremely preferably 86% by mass or less, highly preferably 85% by mass or less, even more preferably 82% by mass or less, further preferably 80% by mass or less, and particularly preferably 78% by mass or less, on the basis of the entire abrasive grains, from the viewpoint that the polishing rate for a carbon-containing silicon oxide is further improved. From the above-described viewpoints, the content of the first particles in the abrasive grains is more preferably 50 to 95% by mass on the basis of the entire abrasive grains.

The lower limit of the content of the second particles in the abrasive grains is preferably 5% by mass or more, more preferably 7% by mass or more, further preferably 10% by mass or more, particularly preferably 12% by mass or more, extremely preferably 14% by mass or more, highly preferably 15% by mass or more, even more preferably 18% by mass or more, further preferably 20% by mass or more, and particularly preferably 22% by mass or more, on the basis of the entire abrasive grains (the entire abrasive grains contained in the slurry), from the viewpoint that the polishing rate for a carbon-containing silicon oxide is further improved. The upper limit of the content of the second particles in the abrasive grains is preferably 50% by mass or less, more preferably less than 50% by mass, further preferably 40% by mass or less, particularly preferably 30% by mass or mass or less, and extremely preferably 25% by mass or less, on the basis of the entire abrasive grains, from the viewpoint that the polishing rate for a carbon-containing silicon oxide is further improved. From the above-described viewpoints, the content of the second particles in the abrasive grains is more preferably 5 to 50% by mass on the basis of the entire abrasive grains.

The lower limit of the content of cerium oxide in the abrasive grains is preferably 50% by mass or more, more preferably more than 50% by mass, further preferably 60% by mass or more, particularly preferably 70% by mass or more, and extremely preferably 75% by mass or more, on the basis of the entire abrasive grains (the entire abrasive grains contained in the slurry), from the viewpoint that the polishing rate for a carbon-containing silicon oxide is further improved. The upper limit of the content of cerium oxide in the abrasive grains is preferably 95% by mass or less, more preferably 93% by mass or less, further preferably 90% by mass or less, particularly preferably 88% by mass or less, extremely preferably 86% by mass or less, highly preferably 85% by mass or less, even more preferably 82% by mass or less, further preferably 80% by mass or less, and particularly preferably 78% by mass or less, on the basis of the entire abrasive grains, from the viewpoint that the polishing rate for a carbon-containing silicon oxide is further improved. From the above-described viewpoints, the content of cerium oxide in the abrasive grains is more preferably 50 to 95% by mass on the basis of the entire abrasive grains.

The lower limit of the content of cerium hydroxide in the abrasive grains is preferably 5% by mass or more, more preferably 7% by mass or more, further preferably 10% by mass or more, particularly preferably 12% by mass or more, extremely preferably 14% by mass or more, highly preferably 15% by mass or more, even more preferably 18% by mass or more, further preferably 20% by mass or more, and particularly preferably 22% by mass or more, on the basis of the entire abrasive grains (the entire abrasive grains contained in the slurry), from the viewpoint that the polishing rate for a carbon-containing silicon oxide is further improved. The upper limit of the content of cerium hydroxide in the abrasive grains is preferably 50% by mass or less, more preferably less than 50% by mass, further preferably 40% by mass or less, particularly preferably 30% by mass or less, and extremely preferably 25% by mass or less, on the basis of the entire abrasive grains, from the viewpoint that the polishing rate for a carbon-containing silicon oxide is further improved. From the above-described viewpoints, the content of cerium hydroxide in the abrasive grains is more preferably 5 to 50% by mass on the basis of the entire abrasive grains.

The lower limit of the content of the first particles is preferably 50% by mass or more, more preferably more than 50% by mass, further preferably 60% by mass or more, particularly preferably 70% by mass or more, and extremely preferably 75% by mass or more, on the basis of the total amount of the first particles and the second particles, from the viewpoint that the polishing rate for a carbon-containing silicon oxide is further improved. The upper limit of the content of the first particles is preferably 95% by mass or less, more preferably 93% by mass or less, further preferably 90% by mass or less, particularly preferably 88% by mass or less, extremely preferably 86% by mass or less, highly preferably 85% by mass or less, even more preferably 82% by mass or less, further preferably 80% by mass or less, and particularly preferably 78% by mass or less, on the basis of the total amount of the first particles and the second particles, from the viewpoint that the polishing rate for a carbon-containing silicon oxide is further improved. From the above-described viewpoints, the content of the first particles is more preferably 50 to 95% by mass on the basis of the total amount of the first particles and the second particles.

The lower limit of the content of the second particles is preferably 5% by mass or more, more preferably 7% by mass or more, further preferably 10% by mass or more, particularly preferably 12% by mass or more, extremely preferably 14% by mass or more, highly preferably 15% by mass or more, even more preferably 18% by mass or more, further preferably 20% by mass or more, and particularly preferably 22% by mass or more, on the basis of the total amount of the first particles and the second particles, from the viewpoint that the polishing rate for a carbon-containing silicon oxide is further improved. The upper limit of the content of the second particles is preferably 50% by mass or less, more preferably less than 50% by mass, further preferably 40% by mass or less, particularly preferably 30% by mass or less, and extremely preferably 25% by mass or less, on the basis of the total amount of the first particles and the second particles, from the viewpoint that the polishing rate for a carbon-containing silicon oxide is further improved. From the above-described viewpoints, the content of the second particles is more preferably 5 to 50% by mass on the basis of the total amount of the first particles and the second particles.

The lower limit of the content of the first particles in the slurry is preferably 0.005% by mass or more, more preferably 0.008% by mass or more, further preferably 0.01% by mass or more, particularly preferably 0.03% by mass or more, extremely preferably 0.05% by mass or more, and highly preferably 0.07% by mass or more, on the basis of the total mass of the slurry, from the viewpoint that the polishing rate for a carbon-containing silicon oxide is further improved. The upper limit of the content of the first particles in the slurry is preferably 5% by mass or less, more preferably 3% by mass or less, further preferably 1% by mass or less, particularly preferably 0.5% by mass or less, extremely preferably 0.3% by mass or less, highly preferably 0.2% by mass or less, and even more preferably 0.1% by mass or less, on the basis of the total mass of the slurry, from the viewpoint that the polishing rate for a carbon-containing silicon oxide is further improved and the viewpoint of enhancing the storage stability of the slurry. From the above-described viewpoints, the content of the first particles in the slurry is more preferably 0.005 to 5% by mass on the basis of the total mass of the slurry.

The lower limit of the content of the second particles in the slurry is preferably 0.005% by mass or more, more preferably 0.008% by mass or more, further preferably 0.01% by mass or more, particularly preferably 0.012% by mass or more, extremely preferably 0.015% by mass or more, highly preferably 0.018% by mass or more, even more preferably 0.02% by mass or more, further preferably 0.0225% by mass or more, and particularly preferably 0.023% by mass or more, on the basis of the total mass of the slurry, from the viewpoint of further enhancing a chemical interaction between the abrasive grains and a surface to be polished so that the polishing rate for a carbon-containing silicon oxide is further improved. The upper limit of the content of the second particles in the slurry is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, further preferably 0.035% by mass or less, and further preferably 0.03% by mass or less, on the basis of the total mass of the slurry, from the viewpoints of easily avoiding the aggregation of the abrasive grains, and easily obtaining a more favorable chemical interaction between the abrasive grains and a surface to be polished to easily utilize the properties of the abrasive grains effectively. From the above-described viewpoints, the content of the second particles in the slurry is more preferably 0.005 to 5% by mass on the basis of the total mass of the slurry.

The lower limit of the content of cerium oxide in the slurry is preferably 0.005% by mass or more, more preferably 0.008% by mass or more, further preferably 0.01% by mass or more, particularly preferably 0.03% by mass or more, extremely preferably 0.05% by mass or more, and highly preferably 0.07% by mass or more, on the basis of the total mass of the slurry, from the viewpoint that the polishing rate for a carbon-containing silicon oxide is further improved. The upper limit of the content of cerium oxide in the slurry is preferably 5% by mass or less, more preferably 3% by mass or less, further preferably 1% by mass or less, particularly preferably 0.5% by mass or less, extremely preferably 0.3% by mass or less, highly preferably 0.2% by mass or less, and even more preferably 0.1% by mass or less, on the basis of the total mass of the slurry, from the viewpoint that the polishing rate for a carbon-containing silicon oxide is further improved and the viewpoint of enhancing the storage stability of the slurry. From the above-described viewpoints, the content of cerium oxide in the slurry is more preferably 0.005 to 5% by mass on the basis of the total mass of the slurry.

The lower limit of the content of cerium hydroxide in the slurry is preferably 0.005% by mass or more, more preferably 0.008% by mass or more, further preferably 0.01% by mass or more, particularly preferably 0.012% by mass or more, extremely preferably 0.015% by mass or more, highly preferably 0.018% by mass or more, even more preferably 0.02% by mass or more, further preferably 0.0225% by mass or more, and particularly preferably 0.023% by mass or more, on the basis of the total mass of the slurry, from the viewpoint of further enhancing a chemical interaction between the abrasive grains and a surface to be polished so that the polishing rate for a carbon-containing silicon oxide is further improved. The upper limit of the content of cerium hydroxide in the slurry is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, further preferably 0.035% by mass or less, and further preferably 0.03% by mass or less, on the basis of the total mass of the slurry, from the viewpoints of easily avoiding the aggregation of the abrasive grains, and easily obtaining a more favorable chemical interaction between the abrasive grains and a surface to be polished to easily utilize the properties of the abrasive grains effectively. From the above-described viewpoints, the content of cerium hydroxide in the slurry is more preferably 0.005 to 5% by mass on the basis of the total mass of the slurry.

The lower limit of the content of the abrasive grains in the slurry is preferably 0.01% by mass or more, more preferably 0.05% by mass or more, and further preferably 0.09% by mass or more, on the basis of the total mass of the slurry, from the viewpoint that the polishing rate for a carbon-containing silicon oxide is further improved. The upper limit of the content of the abrasive grains in the slurry is preferably 10% by mass or less, more preferably 5% by mass or less, further preferably 1% by mass or less, particularly preferably 0.5% by mass or less, and extremely preferably 0.1% by mass or less, on the basis of the total mass of the slurry, from the viewpoint of enhancing the storage stability of the slurry. From the above-described viewpoints, the content of the abrasive grains in the slurry is more preferably 0.01 to 10% by mass on the basis of the total mass of the slurry.

The first particles can have a negative zeta potential. The second particles can have a positive zeta potential. The zeta potential represents the surface potential of a particle. The zeta potential can be measured, for example, using a dynamic light scattering type zeta potential measuring apparatus (for example, trade name: DelsaNano C manufactured by Beckman Coulter, Inc.). The zeta potential of the particles can be adjusted using an additive. For example, by bringing monocarboxylic acid (for example, acetic acid) into contact with particles containing cerium oxide, particles having a positive zeta potential can be obtained. Furthermore, by bringing ammonium dihydrogen phosphate, a material having carboxyl group (for example, polyacrylic acid) or the like into contact with particles containing cerium oxide, particles having a negative zeta potential can be obtained.

It is preferable that the second particles contain cerium hydroxide while satisfying at least one of the following conditions (a) and (b). Incidentally, an "aqueous dispersion liquid" having the content of the second particles adjusted to a predetermined amount means a liquid containing a predetermined amount of the second particles and water.

(a) The second particles provide an absorbance of 1.00 or higher for light having a wavelength of 400 nm in an aqueous dispersion liquid having the content of the second particles adjusted to 1.0% by mass.

(b) The second particles provide an absorbance of 1.000 or higher for light having a wavelength of 290 nm in an aqueous dispersion liquid having the content of the second particles adjusted to 0.0065% by mass.

With regard to the condition (a), by using particles that provide an absorbance of 1.00 or higher for light having a wavelength of 400 nm in an aqueous dispersion liquid having the content of the second particles adjusted to 1.0% by mass, the polishing rate can be further improved. The reasons for this are not necessarily clearly known; however, the present inventors speculate the reasons to be as follows. That is, it is considered that particles including $Ce(OH)_aX_b$ (in the formula, a+b×c=4) composed of tetravalent cerium ($Ce^{4+}$), one to three hydroxide ions ($OH^-$), and one to three anions ($X^{c-}$) are generated (incidentally, such particles are also "cerium hydroxide") depending on production conditions of cerium hydroxide and the like. It is considered that, in $Ce(OH)_aX_b$, an electron-withdrawing anion ($X^{c-}$) acts to enhance reactivity of the hydroxide ion and the polishing rate is improved with the increase in abundance of $Ce(OH)_aX_b$. Further, it is considered that, since particles containing $Ce(OH)_aX_b$ absorbs light having a wavelength of 400 nm, the polishing rate is improved along with an increase in the abundance of $Ce(OH)_aX_b$ for increasing the absorbance for light having a wavelength of 400 nm.

It is considered that the particles containing cerium hydroxide can contain not only $Ce(OH)_aX_b$ but also $Ce(OH)_4$, $CeO_2$, or the like. Examples of the anions ($X^{c-}$) include $NO_3^-$ and $SO_4^{2-}$.

Incidentally, the containing of $Ce(OH)_aX_b$ in the particles containing cerium hydroxide can be confirmed by a method for detecting a peak corresponding to the anions ($X^{c-}$) with FT-IR ATR method (Fourier transform Infra Red Spectrometer Attenuated Total Reflection method) after washing the particles with pure water well. The existence of the anions ($X^{c-}$) can also be confirmed by XPS method (X-ray Photoelectron Spectroscopy).

Here, it has been confirmed that an absorption peak at a wavelength of 400 nm of $Ce(OH)_aX_b$ (for example, $Ce(OH)_3X$) is much smaller than the below-mentioned absorption peak at a wavelength of 290 nm. In this regard, the present inventors conducted an investigation on the magnitude of the absorbance using an aqueous dispersion liquid having a content of 1.0% by mass, which has a relatively large content of particles and whose absorbance is likely to be detected to be high, and as a result, the present inventors found that an effect of improving the polishing rate is excellent in the case of using particles having an absorbance of 1.00 or higher for light having a wavelength of 400 nm in the aqueous dispersion liquid.

The lower limit of the absorbance for light having a wavelength of 400 nm is preferably 1.50 or higher, more preferably 1.55 or higher, and further preferably 1.60 or higher, from the viewpoint that it becomes easier to polish a carbon-containing silicon oxide at a further excellent polishing rate.

With regard to the condition (b), by using second particles having an absorbance of 1.000 or higher for light having a wavelength of 290 nm in an aqueous dispersion liquid having the content of the second particles adjusted to 0.0065% by mass, the polishing rate can be further improved. The reasons for this are not necessarily clearly known; however, the present inventors speculate the reasons to be as follows. That is, particles containing $Ce(OH)_aX_b$ (for example, $Ce(OH)_3X$), which are produced depending on the production conditions for the cerium hydroxide and the like, have an absorption peak near the wavelength of 290 nm according to calculations, and for example, particles composed of $Ce^{4+}(OH^-)_3NO_3^-$ have an absorption peak at the wavelength of 290 nm. Therefore, it is considered that, as the abundance of $Ce(OH)_aX_b$ increases and thereby the absorbance for light having a wavelength of 290 nm increases, the polishing rate is improved.

Here, the absorbance for light having a wavelength of about 290 nm tends to be detected to a greater degree as the measuring limit is exceeded. In this regard, the present inventors conducted an investigation on the magnitude of the absorbance using an aqueous dispersion liquid having a content of 0.0065% by mass, which has a relatively small content of particles and whose absorbance is easily detected to a small degree, and as a result, the present inventors found that the effect of improving the polishing rate is excellent in the case of using particles that provide an absorbance of 1.000 or higher for light having a wavelength of 290 nm in the aqueous dispersion liquid.

The lower limit of the absorbance for light having a wavelength of 290 nm is more preferably 1.050 or higher, further preferably 1.100 or higher, particularly preferably 1.130 or higher, and extremely preferably 1.150 or higher, from the viewpoint of polishing a carbon-containing silicon oxide at a further excellent polishing rate. The upper limit of the absorbance for light having a wavelength of 290 nm is not particularly limited; however, for example, it is preferably 10.00 or lower.

In a case where the second particles, which provide an absorbance of 1.00 or higher for light having a wavelength of 400 nm, provide an absorbance of 1.000 or higher for light having a wavelength of 290 nm in an aqueous dispersion liquid having the content of the second particles adjusted to 0.0065% by mass, a carbon-containing silicon oxide can be polished at a further excellent polishing rate.

Furthermore, cerium hydroxide (for example, $Ce(OH)_aX_b$) tends not to absorb light having a wavelength of 450 nm or higher (particularly, a wavelength of 450 to 600 nm). Therefore, from the viewpoint of suppressing adverse influence on polishing as a result of containing impurities, and thereby polishing a carbon-containing silicon oxide at a further excellent polishing rate, it is preferable that the second particles provide an absorbance of 0.010 or lower for light having a wavelength of 450 to 600 nm in an aqueous dispersion liquid having the content of the second particles adjusted to 0.0065% by mass (65 ppm). That is, it is preferable that the absorbance for entire light in the wavelength range of 450 to 600 nm in an aqueous dispersion liquid having the content of the second particles adjusted to 0.0065% by mass does not exceed 0.010. The upper limit of the absorbance for light having a wavelength of 450 to 600 nm is more preferably lower than 0.010. The lower limit of the absorbance for light having a wavelength of 450 to 600 nm is preferably 0.

The absorbance in an aqueous dispersion liquid can be measured using, for example, a spectrophotometer (device name: U3310) manufactured by Hitachi, Ltd. Specifically, for example, an aqueous dispersion liquid having the content of the second particles adjusted to 1.0% by mass or 0.0065% by mass is prepared as a measuring sample. About 4 mL of this measuring sample is introduced into a 1-cm square cell, and the cell is placed in the device. Next, measurement of the absorbance is performed in the wavelength range of 200 to 600 nm, and the absorbance is determined from a chart thus obtained.

It is preferable that the second particles contained in the slurry of the present embodiment provide a light transmittance of 50%/cm or more for light having a wavelength of 500 nm in an aqueous dispersion liquid having the content of the second particles adjusted to 1.0% by mass. Thereby, a decrease in the polishing rate due to the addition of an additive can be further suppressed, and therefore, it becomes easy to obtain other characteristics while maintaining the polishing rate. From this viewpoint, the lower limit of the light transmittance is more preferably 60%/cm or more, further preferably 70%/cm or more, particularly preferably 80%/cm or more, extremely preferably 90%/cm or more, and highly preferably 92%/cm or more. The upper limit of the light transmittance is 100%/cm.

The reason why it is possible to suppress a decrease in the polishing rate by adjusting the light transmittance of the second particles like this is not understood in detail; however, the present inventors consider the reason as follows. It is considered that, in particles containing cerium hydroxide, chemical action becomes predominant over mechanical action. Therefore, it is considered that the number of particles contributes to the polishing rate rather than the size of the particles.

In a case where the light transmittance of an aqueous dispersion liquid having a content of particles of 1.0% by mass is low, it is considered that the particles present in the aqueous dispersion liquid contain a relatively larger portion of particles having a large particle size (hereinafter, referred to as "coarse particles"). When an additive (for example, polyvinyl alcohol (PVA)) is added to a slurry containing such particles, coarse particles serve as nuclei, and other particles aggregate around thereon. As a result, it is considered that, since the number of particles acting on the surface to be polished per unit area (effective number of particles) is reduced, and the specific surface area of the particles that are in contact with the surface to be polished is reduced, a decrease in the polishing rate is induced.

On the other hand, in a case where the light transmittance in an aqueous dispersion liquid having a content of particles of 1.0% by mass is high, it is considered that the particles present in the aqueous dispersion liquid are in a state in which there are few "coarse particles". In a case where the abundance of coarse particles is small like this, even if an additive (for example, polyvinyl alcohol) is added to the slurry, since there are few coarse particles that become the nuclei of aggregation, aggregation between particles is suppressed, or the size of the aggregated particles becomes smaller. As a result, it is considered that, since the number of particles acting on the surface to be polished per unit area (effective number of particles) is maintained, and the specific surface area of the particles that are in contact with the surface to be polished is maintained, a decrease in the polishing rate does not easily occur.

According to the investigation of the present inventors, it can be seen that, even for slurries having the same particle size measured with a general particle size analyzer, there may be a slurry that is visually transparent (the light transmittance is high) and a slurry that is visually cloudy (the light transmittance is low). From this, it is considered that coarse particles that can cause such action as described above contribute to a decrease in the polishing rate even with a very small amount that is undetectable with a general particle size analyzer.

Furthermore, it can be seen that, even if filtration is repeated several times in order to reduce coarse particles, the occurrence that the polishing rate is decreased by an additive is not much ameliorated, and the above-described effect of improving the polishing rate due to the absorbance may not be sufficiently exhibited. Thus, the present inventors found that the above-described problems can be solved by devising the production method for particles or the like and using particles having a high light transmittance in an aqueous dispersion liquid.

The light transmittance can be measured with a spectrophotometer. Specifically, for example, it can be measured with a spectrophotometer U3310 manufactured by Hitachi, Ltd.

As a more specific measurement method, an aqueous dispersion liquid having the content of the second particles adjusted to 1.0% by mass is prepared as a measuring sample. About 4 mL of this measuring sample is introduced into a 1-cm square cell, the cell is placed in the device, and then measurement is performed.

The absorbance and light transmittance that are provided in the aqueous dispersion liquid by the second particles contained in the slurry can be measured by removing solid components other than the second particles and liquid components other than water, subsequently preparing an aqueous dispersion liquid having a predetermined content, and performing measurement using this aqueous dispersion liquid. It may vary depending on the components contained in the slurry; however, for the removal of solid components or liquid components, for example, a centrifugation method such as centrifugation using a centrifuge that can apply a gravitational acceleration of several thousand G or less, or super-centrifugation using a super-centrifuge that can apply a gravitational acceleration of several ten thousand G or greater; a chromatographic method such as partition chromatography, adsorption chromatography, gel permeation chromatography, or ion exchange chromatography; a filtration method such as natural filtration, filtration under reduced pressure, pressure filtration, or ultrafiltration; and a distillation method such as reduced pressure distillation or normal pressure distillation, can be used, and these may also be used in combination as appropriate.

For example, in a case where a compound having a weight average molecular weight of several ten thousands or more (for example, 50000 or more) is contained, examples of a separation method for the second particles include a chromatographic method and a filtration method, and among these, at least one selected from the group consisting of gel permeation chromatography and ultrafiltration is preferred. In the case of using a filtration method, the particles contained in the slurry can be passed through a filter by setting appropriate conditions. In a case where a compound having a weight average molecular weight of several ten thousands or less (for example, less than 50000) is contained, examples of the separation method for the second particles include a chromatographic method, a filtration method, and a distillation method, and at least one selected from the group consisting of gel permeation chromatography, ultrafiltration, and distillation under reduced pressure is preferred. In a case where a plurality of kinds of particles are contained, examples of the separation method for the second particles include a filtration method and a centrifugation method, and more particles containing cerium hydroxide are contained in the filtrate in the case of filtration, while more particles are contained in the liquid phase in the case of centrifugation.

As a method of separating solid components other than the second particles, for example, it is possible to separate under the following conditions for centrifugation.

Centrifugal separator: Optima MAX-TL (manufactured by Beckman Coulter, Inc.)
Centrifugal acceleration: $50.8 \times 10^4$ G
Treatment time: 5 minutes
Treatment temperature: 25° C.

As a method of separating the second particles by a chromatographic method, for example, it is possible to isolate the second particles and/or other components under the following conditions.

Sample solution: 100 μL of slurry
Detector: Manufactured by Hitachi, Ltd., UV-VIS detector, trade name "L-4200"
Wavelength: 400 nm
Integrator: Manufactured by Hitachi, Ltd., GPC integrator, trade name "D-2500"
Pump: Manufactured by Hitachi, Ltd., trade name "L-7100"
Column: Manufactured by Hitachi Chemical Co., Ltd., water-based packed column for HPLC, trade name "GL-W550S"
Eluent: Deionized water
Measurement temperature: 23° C.
Flow rate: 1 mL/min (pressure is about 40 to 50 kg/cm$^2$)
Measurement time: 60 minutes Depending on the components contained in the slurry, there is a possibility that the second particles may not be isolated even under the above-described conditions; however, in that case, it is possible to separate by optimizing the amount of the sample solution, the type of column, the type of eluent, the measurement temperature, the flow rate, and the like. Furthermore, there is a possibility that it is possible to separate from the second particles by adjusting the pH of the slurry to adjust the distillation time for the components contained in the slurry. In a case where there are insoluble components in the slurry, it is preferable to remove the insoluble components by filtration, centrifugation, and the like, according to necessity.

The slurry of the present embodiment may contain particles other than the composite particles including the first particles and the second particles. Examples of such other particles include the first particles not in contact with the second particles; the second particles not in contact with the first particles; and third particles composed of silica, alumina, zirconia, yttria, or the like (particles not including the first particles and the second particles).

(Liquid Medium)

The liquid medium is not particularly limited; however, water such as deionized water or ultrapure water is preferred. The content of the liquid medium may be the balance of the slurry remaining after excluding the contents of other constituent components, and the content is not particularly limited.

(Optional Components)

The slurry of the present embodiment may further contain optional additives. Examples of the optional additives include a material having a carboxyl group (excluding a compound corresponding to a polyoxyalkylene compound or a water-soluble polymer), a polyoxyalkylene compound, a water-soluble polymer, an oxidizing agent (for example, hydrogen peroxide), and a dispersant (for example, a phosphoric acid-based inorganic salt). The respective additives can be used singly or in combination of two or more kinds thereof.

Examples of the material having a carboxyl group include monocarboxylic acids such as acetic acid, propionic acid, butyric acid, and valeric acid; hydroxy acids such as lactic acid, malic acid, and citric acid; dicarboxylic acids such as malonic acid, succinic acid, fumaric acid, and maleic acid; polycarboxylic acids such as polyacrylic acid and polymaleic acid; and amino acids such as arginine, histidine, and lysine.

Examples of the polyoxyalkylene compound include a polyalkylene glycol and a polyoxyalkylene derivative.

Examples of the polyalkylene glycol include polyethylene glycol, polypropylene glycol, and polybutylene glycol. The polyalkylene glycol is preferably at least one selected from the group consisting of polyethylene glycol and polypropylene glycol, and is more preferably polyethylene glycol.

A polyoxyalkylene derivative is, for example, a compound obtained by introducing a functional group or a substituent to a polyalkylene glycol, or a compound obtained by adding a polyalkylene oxide to an organic compound. Examples of the functional group or a substituent include an alkyl ether group, an alkyl phenyl ether group, a phenyl ether group, a styrenated phenyl ether group, a glyceryl ether group, an alkylamine group, a fatty acid ester group, and a glycol ester group. Examples of the polyoxyalkylene derivative include a polyoxyethylene alkyl ether, polyoxyethylene bisphenol ether (for example, manufactured by NIPPON NYUKAZAI CO., LTD., BA GLYCOL series), polyoxyethylene styrenated phenyl ether (for example, manufactured by Kao Corporation, EMULGEN series), a polyoxyethylene alkyl phenyl ether (for example, manufactured by DKS Co. Ltd., NOIGEN EA series), a polyoxyalkylene polyglyceryl ether (for example, manufactured by Sakamoto Yakuhin Kogyo Co., Ltd., SC-E series and SC-P series), a polyoxyethylene sorbitan fatty acid ester (for example, manufactured by DKS Co. Ltd., SORGEN TW series), a polyoxyethylene fatty acid ester (for example, manufactured by Kao Corporation, EMANON series), a polyoxyethylene alkylamine (for example, manufactured by DKS Co. Ltd., AMIRADIN D), and other compounds having a polyalkylene oxide added thereto (for example, manufactured by Nissin Chemical Co., Ltd., SURFINOL 465, and manufactured by NIPPON NYUKAZAI CO., LTD., TMP series).

The "water-soluble polymer" is defined as a polymer which is dissolved in 100 g of water in an amount of 0.1 g or more. A polymer that corresponds to the polyoxyalkylene compound is not to be included in the "water-soluble polymer". The water-soluble polymer is not particularly limited, and examples include acrylic polymers such as polyacrylamide and polydimethylacrylamide; polysaccharides such as carboxymethyl cellulose, agar, curdlan, dextrin, cyclodextrin, and pullulan; vinyl-based polymers such as polyvinyl alcohol, polyvinylpyrrolidone, and polyacrolein; glycerin-based polymers such as polyglycerin and a polyglycerin derivative; and polyethylene glycol.

(Characteristics of Slurry)

In a case where the content of the abrasive grains is 0.1% by mass, the absorbance for light having a wavelength of 380 nm in a liquid phase (supernatant solution) obtained when the slurry of the present embodiment is subjected to centrifugal separation for 5 minutes at a centrifugal acceleration of $5.8 \times 10^4$ G preferably exceeds 0. In this case, it is possible to further improve the polishing rate for a carbon-containing silicon oxide.

The reasons why the polishing rate is improved in this way are, for example, the reasons to be as follows. However, the reasons are not limited to the reasons to be as follows.

That is, in a case where the absorbance for light having a wavelength of 380 nm in a liquid phase obtained when the slurry is subjected to centrifugal separation exceeds 0, in such centrifugal separation, the composite particles are easy to be selectively removed, a liquid phase containing, as solid contents, particles that are free (hereinafter, referred to as "free particles"; for example, second particles not in contact with the first particles) can be obtained, and in a case where the absorbance exceeds 0, the abrasive grains include free particles (for example, the second particles not in contact with the first particles) in addition to the composite particles in the slurry. Since the free particles have a smaller particle size than that of the composite particles, the free particles have a high diffusion rate in the slurry and are preferentially adsorbed to a surface of a carbon-containing silicon oxide to coat the surface. In this case, as well as acting directly on the carbon-containing silicon oxide, the composite particles can act on free particles adsorbed to the carbon-containing silicon oxide to act indirectly on the carbon-containing silicon oxide (for example, the mechanical action can be transferred to the carbon-containing silicon oxide through free particles adsorbed to the carbon-containing silicon oxide).

The absorbance for light having a wavelength of 380 nm in a liquid phase obtained when the slurry of the present embodiment is subjected to centrifugal separation for 5 minutes at a centrifugal acceleration of $5.8 \times 10^4$ G is preferably in the following range. The above-described absorbance is preferably 0.001 or higher, more preferably 0.002 or higher, further preferably 0.01 or higher, particularly preferably 0.03 or higher, extremely preferably 0.05 or higher, highly preferably 0.08 or higher, even more preferably 0.09 or higher, further preferably 0.1 or higher, and particularly preferably 0.2 or higher, from the viewpoint that the polishing rate for a carbon-containing silicon oxide is further improved. In a case where the content of free particles in the slurry is large, it is speculated that the amount of adsorption of free particles with respect to the carbon-containing silicon oxide is increased, and thus the polishing rate for a carbon-containing silicon oxide is further improved. The above-described absorbance is preferably 0.5 or less, more preferably 0.4 or less, further preferably 0.3 or less, particularly preferably 0.25 or less, and extremely preferably 0.22 or less, from the viewpoint that the polishing rate for a carbon-containing silicon oxide is further improved. From the above-described viewpoints, the above-described absorbance is more preferably more than 0 and 0.5 or less. The above-described absorbance can be adjusted by adjusting the content of free particles in the abrasive grains. For example, the above-described absorbance can be decreased by increasing the surface area of the first particles with which the second particles are in contact, adjusting a state to an insufficient dispersion state when the first particles and the second particles are brought into contact with each other (by decreasing a dispersion time, decreasing the number of rotations in stirring of a liquid containing the first particles and the second particles, weakening electrostatic repulsion generated between particles, or the like), and the like.

In the present embodiment, abrasive grains having an absorbance for light having a wavelength of 380 nm in a liquid phase obtained when the slurry is subjected to centrifugal separation is 0 may be used. Such abrasive grains can be obtained by removing free particles by centrifugal separation.

The light transmittance for light having a wavelength of 500 nm in a liquid phase obtained when the slurry of the present embodiment (for example, the slurry in a case where the content of the abrasive grains is 0.1% by mass) is subjected to centrifugal separation for 5 minutes at a centrifugal acceleration of $5.8 \times 10^4$ G is preferably 50%/cm or more, more preferably 60%/cm or more, further preferably 70%/cm or more, particularly preferably 80%/cm or more, extremely preferably 90%/cm or more, and highly preferably 92%/cm or more, from the viewpoint that the polishing rate for an insulating material is further improved. The upper limit of the light transmittance is 100%/cm.

The lower limit of the pH of the slurry of the present embodiment is preferably 2.0 or more, more preferably 2.5 or more, further preferably 2.8 or more, particularly preferably 3.0 or more, extremely preferably 3.2 or more, highly preferably 3.5 or more, even more preferably 4.0 or more, further preferably 4.2 or more, and particularly preferably 4.3 or more, from the viewpoint that the polishing rate for a carbon-containing silicon oxide is further improved. The upper limit of the pH is preferably 7.0 or less, more preferably 6.5 or less, further preferably 6.0 or less, particularly preferably 5.0 or less, extremely preferably 4.8 or less, highly preferably 4.7 or less, even more preferably 4.6 or less, further preferably 4.5 or less, and particularly preferably 4.4 or less, from the viewpoint that the storage stability of the slurry is further improved. From the above-described viewpoints, the pH is more preferably 2.0 to 7.0. The pH of the slurry is defined as the pH at a liquid temperature of 25° C.

The pH of the slurry can be adjusted by means of an acid component such as an inorganic acid or an organic acid; an alkali component such as ammonia, sodium hydroxide, tetramethylammonium hydroxide (TMAH), imidazole, or an alkanolamine; or the like. A buffering agent may be added in order to stabilize the pH. A buffering agent may be added as a buffer solution (a liquid containing a buffering agent). Examples of such a buffer solution include an acetate buffer solution and a phthalate buffer solution.

The pH of the slurry of the present embodiment can be measured by a pH meter (for example, Model No. PHL-40 manufactured by DKK-TOA CORPORATION). Specifically, for example, a pH meter is subjected to two-point calibration using a phthalate pH buffer solution (pH: 4.01) and a neutral phosphate pH buffer solution (pH: 6.86) as standard buffer solutions, subsequently the electrode of the pH meter is introduced into the slurry, and the value after being stabilized after a lapse of two minutes or longer is measured. The liquid temperatures of the standard buffer solutions and the slurry are all set to 25° C.

In a case where the slurry of the present embodiment is used as a CMP polishing liquid, the constituent components of the polishing liquid may be stored as a one-pack polishing liquid, or may be stored as a multi-pack (for example, two-pack) polishing liquid set in which the constituent components of the polishing liquid are divided into a slurry and an additive liquid such that a slurry (first liquid) containing abrasive grains and a liquid medium, and an additive liquid (second liquid) containing additives and a liquid medium are mixed to form the polishing liquid. The additive liquid may contain, for example, an oxidizing agent. The constituent components of the polishing liquid may be stored as a polishing liquid set divided into three or more liquids.

In the polishing liquid set, the slurry and the additive liquid are mixed immediately before polishing or during polishing to prepare the polishing liquid. Furthermore, a one-pack polishing liquid may be stored as a stock solution for a polishing liquid with a reduced liquid medium content and used by dilution with a liquid medium at the time of polishing. A multi-pack polishing liquid set may be stored as a stock solution for a slurry and a stock solution for an additive liquid with reduced liquid medium contents, and used by dilution with a liquid medium at the time of polishing.

<Polishing Method>

The polishing method of the present embodiment (such as a polishing method of a base substrate) includes a polishing step of polishing a surface to be polished (such as a surface to be polished of a base substrate) by using the slurry. The surface to be polished contains a carbon-containing silicon oxide. The slurry in the polishing step may be a polishing liquid obtained by mixing the slurry and the additive liquid of the above-described polishing liquid set.

In the polishing step, for example, in a state where a material to be polished of the base substrate that has the material to be polished is pressed against a polishing pad (polishing cloth) of a polishing platen, the slurry is supplied between the material to be polished and the polishing pad, and the base substrate and the polishing platen are moved relative to each other to polish the surface to be polished of the material to be polished. In the polishing step, for example, at least a part of a material to be polished is removed by polishing.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. As the material to be polished, a carbon-containing silicon oxide can be used. The material to be polished may be a single material or a plurality of materials. In a case where a plurality of materials are exposed on a surface to be polished, they can be considered as a material to be polished. The material to be polished may be in the form of a film (film to be polished) or may be a carbon-containing silicon oxide film or the like.

By polishing a material to be polished formed on such a substrate with the above-described slurry and removing an excess part, it is possible to eliminate irregularities on the surface of a material to be polished and to produce a smooth surface over the entire surface of the polished material.

In the polishing method of the present embodiment, as a polishing apparatus, it is possible to use a common polishing apparatus which has a holder capable of holding a base substrate having a surface to be polished and a polishing platen to which a polishing pad can be pasted. A motor or the like in which the number of rotations can be changed is attached to each of the holder and the polishing platen. As the polishing apparatus, for example, polishing apparatus: F-REX300 manufactured by EBARA CORPORATION, or polishing apparatus: MIRRA manufactured by Applied Materials, Inc. can be used.

As the polishing pad, common unwoven cloth, a foamed body, an unfoamed body, and the like can be used. As the material for the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. Particularly, from the viewpoint of obtaining further excellent polishing rate and flattening properties, the material for the polishing pad is preferably at least one selected from the group consisting of a foamed polyurethane and a non-foamed polyurethane. It is preferable that the polishing pad is subjected to groove processing, by which the slurry accumulates thereon.

Polishing conditions are not limited, but the upper limit of the rotation speed of a polishing platen is preferably 200 $min^{-1}$ ($min^{-1}$=rpm) or less such that the base substrate is not let out, and the upper limit of the polishing pressure to be applied to the base substrate (processing load) is preferably 100 kPa or less from the viewpoint of easily suppressing the generation of polishing scratches. The slurry is preferably continuously supplied to the polishing pad with a pump or the like during polishing. There are no limitations on the supply amount for this, however, it is preferable that the surface of the polishing pad is always covered with the slurry.

The present embodiment can polish a surface to be polished containing a carbon-containing silicon oxide. The present embodiment can be suitably used in formation of an STI and polishing of an interlayer insulating material at a high rate. The lower limit of the polishing rate of the carbon-containing silicon oxide is preferably 50 nm/min or more, more preferably 100 nm/min or more, further preferably 120 nm/min or more, and particularly preferably 150 nm/min or more.

The present embodiment can also be used in polishing of a pre-metal insulating material. Examples of the pre-metal insulating material include silicon oxide, phosphorus-silicate glass, boron-phosphorus-silicate glass, silicon oxyfluoride, and fluorinated amorphous carbon.

The present embodiment can also be applied to an insulating material other than the carbon-containing silicon oxide. Examples of such a material include high permittivity materials such as Hf-based, Ti-based, and Ta-based oxides; semiconductor materials such as silicon, amorphous silicon, SiC, SiGe, Ge, GaN, GaP, GaAs, and organic semiconductors; phase-change materials such as GeSbTe; inorganic electroconductive materials such as ITO; and polymer resin materials such as polyimide-based, polybenzooxazole-based, acrylic, epoxy-based, and phenol-based materials.

The present embodiment can be applied not only to film-like objects to be polished, but also to various types of substrates made of glass, silicon, SiC, SiGe, Ge, GaN, GaP, GaAs, sapphire, plastics, or the like.

The present embodiment can be used not only for the production of semiconductor elements, but also for the production of image display devices such as TFT or organic EL; optical components such as a photomask, a lens, a prism, an optical fiber, or a single crystal scintillator; optical elements such as an optical switching element or an optical waveguide; light-emitting elements such as a solid laser or a blue laser LED; and magnetic storage devices such as a magnetic disc or a magnetic head.

According to the present embodiment, it is possible to provide a method for producing abrasive grains, the method including a step of bringing first particles containing cerium oxide into contact with second particles containing a cerium compound. According to the present embodiment, it is possible to provide a method for producing a slurry, the method including a step of obtaining abrasive grains by the method for producing abrasive grains.

EXAMPLES

Hereinafter, the present invention will be specifically described based on Examples; however, the present invention is not limited to the following Examples.

<Preparation of Cerium Oxide Slurry>

Particles containing cerium oxide (first particles; hereinafter, referred to as "cerium oxide particles") and trade name; ammonium dihydrogen phosphate manufactured by Wako Pure Chemical Industries, Ltd. (molecular weight: 97.99) were mixed to prepare a cerium oxide slurry (pH: 7) containing 5.0% by mass (solid content amount) of the cerium oxide particles. The mixing amount of the ammonium dihydrogen phosphate was adjusted to 1% by mass on the basis of the total amount of the cerium oxide particles.

An adequate amount of the cerium oxide slurry was introduced into trade name: MICROTRAC MT3300EXII manufactured by MicrotracBEL Corp., and the average particle size of the cerium oxide particles was measured. The displayed average particle size value was obtained as the average particle size (average secondary particle size). The average particle size of the cerium oxide particles in the cerium oxide slurry was 145 nm.

An adequate amount of the cerium oxide slurry was introduced into trade name: DelsaNano C manufactured by Beckman Coulter, Inc. and measurement was performed twice at 25° C. The average value of the displayed zeta potentials was obtained as the zeta potential. The zeta potential of the cerium oxide particles in the cerium oxide slurry was −55 mV.

<Preparation of Cerium Hydroxide Slurry>

(Synthesis of Cerium Hydroxide)

480 g of an aqueous 50% by mass $Ce(NH_4)_2(NO_3)_6$ solution (trade name: CANSO liquid manufactured by Nihon Kagaku Sangyo Co., Ltd.) was mixed with 7450 g of pure water to obtain a solution. Next, while this solution was stirred, 750 g of an aqueous solution of imidazole (10% by mass aqueous solution, 1.47 mol/L) was added dropwise thereto at a mixing rate of 5 mL/min, and thereby a precipitate containing cerium hydroxide was obtained. The cerium hydroxide was synthesized at a temperature of 20° C. and a stirring speed of 500 $min^{-1}$ The stirring was performed using a 3-blade pitch paddle with a total blade section length of 5 cm.

The obtained precipitate (precipitate containing cerium hydroxide) was subjected to centrifugal separation (4000 $min^{-1}$, for 5 minutes), and then subjected to solid-liquid separation with removal of a liquid phase by decantation. 10 g of the particles obtained by solid-liquid separation were mixed with 990 g of water, and then the particles were dispersed in water using an ultrasonic cleaner, thereby preparing a cerium hydroxide slurry (content of particles: 1.0% by mass) containing particles that contained cerium hydroxide (second particles; hereinafter, referred to as "cerium hydroxide particles").

(Measurement of Average Particle Size)

When the average particle size (average secondary particle size) of the cerium hydroxide particles in the cerium hydroxide slurry was measured using trade name: N5 manufactured by Beckman Coulter, Inc., a value of 10 nm was obtained. The measuring method was as follows. First, about 1 mL of a measuring sample (cerium hydroxide slurry, aqueous dispersion liquid) containing 1.0% by mass of cerium hydroxide particles was introduced into a 1-cm square cell, and then the cell was placed in the N5. Measurement was performed at 25° C. with the refractive index set to 1.333 and the viscosity set to 0.887 mPa·s as the measuring sample information of N5 software, and the value displayed as Unimodal Size Mean was read off (Measurement of Zeta Potential)

An adequate amount of the cerium hydroxide slurry was introduced into trade name: DelsaNano C manufactured by Beckman Coulter, Inc. and measurement was performed twice at 25° C. The average value of the displayed zeta potentials was obtained as the zeta potential. The zeta potential of the cerium hydroxide particles in the cerium hydroxide slurry was +50 mV.

(Structural Analysis of Cerium Hydroxide Particles)

An adequate amount of the cerium hydroxide slurry was taken and vacuum-dried to isolate the cerium hydroxide particles, and then sufficiently washed with pure water to obtain a sample. When the obtained sample was measured by FT-IR ATR method, a peak based on nitrate ion ($NO_3^-$) was observed in addition to a peak based on hydroxide ion ($OH^-$). Furthermore, when the same sample was measured by XPS (N-XPS) for nitrogen, a peak based on nitrate ion was observed while no peak based on $NH_4^+$ was observed. These results confirmed that the cerium hydroxide particles at least partially contained particles having nitrate ion bonded to a cerium element. Furthermore, since particles having hydroxide ion bonded to a cerium element were at least partially contained in the cerium hydroxide particles, it was confirmed that the cerium hydroxide particles contained cerium hydroxide. These results confirmed that the cerium hydroxide contained a hydroxide ion bonded to a cerium element.

(Measurement of Absorbance and Light Transmittance)

An adequate amount of a cerium hydroxide slurry was taken and diluted with water such that the content of particles became 0.0065% by mass (65 ppm), and thus, a measuring sample (aqueous dispersion liquid) was obtained. About 4 mL of this measuring sample was introduced into a 1-cm square cell, and the cell was placed in a spectrophotometer (device name: U3310) manufactured by Hitachi, Ltd. Measurement of the absorbance in a wavelength range of 200 to 600 nm was performed, and the absorbance for light having a wavelength of 290 nm and the absorbance for a light having a wavelength of 450 to 600 nm were measured. The absorbance for light having a wavelength of 290 nm was 1.192, and the absorbance for light having a wavelength of 450 to 600 nm was less than 0.010.

About 4 mL of a cerium hydroxide slurry (content of particles: 1.0% by mass) was introduced into a 1-cm square cell, and the cell was placed in a spectrophotometer (device name: U3310) manufactured by Hitachi, Ltd. Measurement of the absorbance in a wavelength range of 200 to 600 nm was performed, and the absorbance for light having a wavelength of 400 nm and the light transmittance for light having a wavelength of 500 nm were measured. The absorbance for light having a wavelength of 400 nm was 2.25, and the light transmittance for light having a wavelength of 500 nm was 92%/cm.

<Preparation of Slurry>

Example 1

While stirring at a rotation speed of 300 rpm using a stirring blade of two blades, 20 g of the cerium hydroxide slurry and 1940 g of ion-exchange water were mixed to obtain a mixed liquid. Subsequently, after mixing 40 g of the cerium oxide slurry in the mixed liquid while stirring the mixed liquid, stirring was performed while being irradiated with ultrasonic waves using an ultrasonic cleaner (device name: US-105) manufactured by SND Co., Ltd. Thereby, a test slurry containing cerium hydroxide particles (free particles) that were not in contact with cerium oxide particles in addition to composite particles including cerium oxide particles and cerium hydroxide particles that were in contact with the cerium oxide particles (content of cerium oxide particles: 0.1% by mass, content of cerium hydroxide particles: 0.01% by mass, pH: 4.1) was prepared. The pH of the test slurry was measured using Model No. PHL-40 manufactured by DKK-TOA CORPORATION (the same applies hereinafter).

Example 2

While stirring at a rotation speed of 300 rpm using a stirring blade of two blades, 30 g of the cerium hydroxide slurry and 1930 g of ion-exchange water were mixed to obtain a mixed liquid. Subsequently, after mixing 40 g of the cerium oxide slurry in the mixed liquid while stirring the mixed liquid, stirring was performed while being irradiated with ultrasonic waves using an ultrasonic cleaner (device name: US-105) manufactured by SND Co., Ltd. Thereby, a test slurry containing cerium hydroxide particles (free particles) that were not in contact with cerium oxide particles in addition to composite particles including cerium oxide particles and cerium hydroxide particles that were in contact with the cerium oxide particles (content of cerium oxide particles: 0.1% by mass, content of cerium hydroxide particles: 0.015% by mass, pH: 3.9) was prepared.

Example 3

30 g of the cerium hydroxide slurry, 50 g of ion-exchange water, and 20 g of the cerium oxide slurry were sequentially added to a 1-mm-diameter cylindrical container containing zirconia beads to obtain a mixed liquid. Subsequently, the mixed liquid was placed on a mix rotor manufactured by AS ONE CORPORATION (device name: MR-5) and stirred at 100 rpm. Thereafter, 900 g of ion-exchange water was added and then stirred. Thereby, a test slurry containing cerium hydroxide particles (free particles) that were not in contact with cerium oxide particles in addition to composite particles including cerium oxide particles and cerium hydroxide particles that were in contact with the cerium oxide particles (content of cerium oxide particles: 0.1% by mass, content of cerium hydroxide particles: 0.03% by mass, pH: 4.4) was prepared.

Comparative Example 1

After mixing 40 g of the cerium oxide slurry and 1960 g of ion-exchange water while stirring the mixed liquid at a rotation speed of 300 rpm using a stirring blade of two blades, stirring was performed while being irradiated with ultrasonic waves using an ultrasonic cleaner (device name: US-105) manufactured by SND Co., Ltd. Thereby, a test slurry containing cerium oxide particles (content of cerium oxide particles: 0.1% by mass, pH: 8.0) was prepared.

Comparative Example 2

After mixing 200 g of the cerium hydroxide slurry and 1800 g of ion-exchange water while stirring the mixed liquid at a rotation speed of 300 rpm using a stirring blade of two blades, stirring was performed while being irradiated with ultrasonic waves using an ultrasonic cleaner (device name: US-105) manufactured by SND Co., Ltd. Thereby, a test slurry containing cerium hydroxide particles (content of cerium hydroxide particles: 0.1% by mass, pH: 4.0) was prepared.

Comparative Example 3

A dispersion liquid of colloidal silica (trade name: Quartron PL-3 manufactured by FUSO CHEMICAL CO., LTD.) was diluted with ion-exchange water to prepare a test slurry (content of silica particles: 0.1% by mass, pH: 7.0).
<Measurement of Zeta Potential of Abrasive Grains>
An adequate amount of the test slurry was introduced into trade name "DelsaNano C" manufactured by Beckman Coulter, Inc. The measurement was performed at 25° C. twice, and the average value of the displayed zeta potentials was adopted. The zeta potential of Examples 1 to 3 was +55 mV, the zeta potential of Comparative Example 1 was −55 mV, the zeta potential of Comparative Example 2 was +50 mV, and the zeta potential of Comparative Example 3 was −35 mV.
<Measurement of Average Particle Size of Abrasive Grains>
Each test slurry mentioned above was introduced in an adequate amount into trade name: MICROTRAC MT3300EXII manufactured by MicrotracBEL Corp., and measurement of the average particle size of the abrasive grains was performed. The displayed average particle size value was obtained as the average particle size (average secondary particle size) of the abrasive grains. The average particle size of Example 1 was 220 nm, the average particle size of Examples 2 and 3 was 155 nm, the average particle size of Comparative Example 1 was 145 nm, the average particle size of Comparative Example 2 was 10 nm, and the average particle size of Comparative Example 3 was 60 nm.
<Measurement of Absorbance and Light Transmittance of Supernatant Solution>
The content of the abrasive grains (the total amount of particles) in the above-described test slurry (excluding Comparative Example 3) was adjusted to 0.1% by mass (diluted with ion-exchange water) to prepare a test liquid. 7.5 g of the test liquid was introduced in a centrifugal separator (trade name: Optima MAX-TL) manufactured by Beckman Coulter, Inc. and treated at a centrifugal acceleration of $5.8 \times 10^4$ G and at a setting temperature of 25° C. for 5 minutes to obtain a supernatant solution.
About 4 mL of the supernatant solution was introduced into a 1-cm square cell made of quartz, and then, the cell was placed in a spectrophotometer (device name: U3310) manufactured by Hitachi, Ltd. Measurement of the absorbance was performed in a wavelength range of 200 to 600 nm, and a value of the absorbance in a wavelength of 380 nm was read from a chart thus obtained. The measurement results are shown in Table 1. Furthermore, as for Examples 1 to 3, a value of the light transmittance in a wavelength of 500 nm was read from the chart thus obtained, and as a result, the value was 92%/cm or more.
<CMP Evaluation>
The content of the abrasive grains (the total amount of particles) in the test slurry was adjusted to 0.1% by mass (diluted with ion-exchange water) to obtain a CMP polishing liquid. The substrate to be polished was polished by using this CMP polishing liquid under the polishing conditions below. Values of the zeta potential, the average particle size of the abrasive grains, and the pH in the CMP polishing liquid were the same as the values in the aforementioned test slurry.

[CMP Polishing Conditions]

Polishing apparatus: MIRRA 3400 (manufactured by Applied Materials, Inc.)

Flow rate of CMP polishing liquid: 250 mL/min

Substrate to be polished: As a blanket wafer having no pattern formed thereon, a substrate to be polished having a black diamond film (BD film, manufactured by Applied Materials, Inc.) having a thickness of 2 μm, which had been formed by a plasma CVD method, on a silicon substrate was used.

Polishing pad: Foamed polyurethane resin having closed pores (manufactured by Dow Chemical Japan Ltd., Model No. IC1010)

Polishing pressure: 20.7 kPa (3.0 psi)

Rotation numbers of substrate to be polished and polishing platen: Substrate to be polished/polishing platen=93/87 rpm Polishing time: 1 min Washing of wafer: After a CMP treatment, washing was performed with water while applying an ultrasonic wave, and then drying was performed with a spin dryer.

The polishing rate for a black diamond film that had been polished and washed under the above-described conditions was obtained by the formula below. The results are shown in Table 1. The film thickness difference of the black diamond film before and after polishing was obtained using a light interference type film thickness measuring apparatus (trade name: F80 manufactured by Filmetrics Japan, Inc.).

Polishing rate (RR)=(Film thickness difference [nm] of black diamond film before and after polishing)/(Polishing time: 1 [min])

TABLE 1

|  | Example | | | Comparative Example | | |
|---|---|---|---|---|---|---|
|  | 1 | 2 | 3 | 1 | 2 | 3 |
| Abrasive grains | Composite particles | | | Cerium oxide | Cerium hydroxide | Silica |
| Absorbance at 380 nm of supernatant solution | 0.002 | 0.068 | 0.205 | 0 | 0.99 | — |
| Polishing rate [nm/min] | 98 | 162 | 177 | 34 | 1 | 2 |

The invention claimed is:

1. A slurry for polishing a carbon-containing silicon oxide, the slurry comprising:
abrasive grains and a liquid medium, wherein
the abrasive grains include first particles and second particles in contact with the first particles,
a particle size of the second particles is smaller than a particle size of the first particles,
the first particles contain cerium oxide,
the second particles contain a cerium compound, and
the cerium compound includes a compound different from cerium oxide.

2. The slurry according to claim 1, wherein, in a case where a content of the abrasive grains is 0.1% by mass, an absorbance for light having a wavelength of 380 nm in a liquid phase obtained when the slurry is subjected to centrifugal separation for 5 minutes at a centrifugal acceleration of $5.8 \times 10^4$ G exceeds 0.

3. The slurry according to claim 1, wherein the cerium compound contains cerium hydroxide.

4. The slurry according to claim 1, wherein a content of the abrasive grains is 0.01 to 10% by mass.

5. A polishing method comprising a step of polishing a surface to be polished by using the slurry according to claim 1.

6. The polishing method according to claim 5, wherein the surface to be polished comprises a carbon-containing silicon oxide.

7. The slurry according to claim 1, wherein a particle size of the first particles is 100 nm or more.

8. The slurry according to claim 1, wherein a particle size of the second particles is 30 nm or less.

9. The slurry according to claim 1, wherein an average particle size of the abrasive grains is 120 nm or more.

10. The slurry according to claim 1, wherein a content of cerium oxide in the abrasive grains is 50 to 95% by mass on the basis of the entire abrasive grains.

11. The slurry according to claim 3, wherein a content of cerium hydroxide in the abrasive grains is 5 to 50% by mass on the basis of the entire abrasive grains.

12. The slurry according to claim 1, wherein a content of the abrasive grains is 0.01 to 0.5% by mass.

13. The slurry according to claim 1, wherein a light transmittance for light having a wavelength of 500 nm in a liquid phase obtained when the slurry is subjected to centrifugal separation for 5 minutes at a centrifugal acceleration of $5.8 \times 10^4$ G is 50%/cm or more.

14. The slurry according to claim 1, wherein pH is 2.0 to 7.0.

15. The slurry according to claim 1, wherein pH is 3.0 to 5.0.

16. A slurry for polishing a carbon-containing silicon oxide, the slurry comprising:
abrasive grains and a liquid medium, wherein
the abrasive grains include first particles and second particles in contact with the first particles,
a particle size of the second particles is smaller than a particle size of the first particles,
the first particles contain cerium oxide,
the second particles contain a cerium compound, and
a content of cerium oxide in the abrasive grains is 50 to 95% by mass on the basis of the entire abrasive grains.

* * * * *